(12) United States Patent
Kim et al.

(10) Patent No.: US 7,755,214 B2
(45) Date of Patent: Jul. 13, 2010

(54) DIODE CIRCUIT HAVING PASSIVE ELEMENT PROPERTY, IMPEDANCE MODULATOR INCLUDING THE DIODE CIRCUIT, AND DC SOURCE INCLUDING THE DIODE CIRCUIT

(75) Inventors: Seung-woo Kim, Suwon-si (KR); Seong-soo Lee, Yongin-si (KR); Jae-sup Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1084 days.

(21) Appl. No.: 11/440,042

(22) Filed: May 25, 2006

(65) Prior Publication Data
US 2007/0040447 A1    Feb. 22, 2007

(30) Foreign Application Priority Data
Jun. 1, 2005    (KR)    ............ 10-2005-0046677

(51) Int. Cl.
*H02J 3/02*    (2006.01)

(52) U.S. Cl. ........................................ 307/11

(58) Field of Classification Search ............... 307/11, 307/130; 363/60, 126
See application file for complete search history.

(56) References Cited

U.S. PATENT DOCUMENTS

| 5,930,133 | A  | * | 7/1999 | Morizuka | .................. | 363/126 |
| 6,760,850 | B1 | * | 7/2004 | Atkinson et al. | ............ | 713/320 |
| 7,192,157 | B2 | * | 3/2007 | Sloan et al. | ................ | 362/216 |

FOREIGN PATENT DOCUMENTS

| JP | 10-163786 | 6/1998 |
| KR | 2003-0024241 | 3/2003 |

* cited by examiner

*Primary Examiner*—Albert W Paladini
(74) *Attorney, Agent, or Firm*—Sughrue Mion, PLLC

(57) ABSTRACT

A diode circuit having a passive element property, and an impedance modulator and a direct current (DC) source that use the diode circuit are provided. The diode circuit includes a first diode that generates a predetermined DC and alternating currents (AC) when a radio frequency (RF) signal is applied; and a DC path that is connected in parallel to the first diode, forms a predetermined loop and circulates the DC current within the loop. The DC path includes an inductor or an LC parallel resonator. The DC path includes a second diode that is disposed in the opposite direction to the first diode and connected to the first diode in parallel. The present invention can relieve difficulty in designing an RF circuit.

21 Claims, 7 Drawing Sheets

DIODE CIRCUIT HAVING PASSIVE ELEMENT PROPERTY, IMPEDANCE MODULATOR INCLUDING THE DIODE CIRCUIT, AND DC SOURCE INCLUDING THE DIODE CIRCUIT

CROSS-REFERENCE TO RELATED APPLICATIONS

This application claims priority from Korean Patent Application No. 10-2005-0046677 filed Jun. 1, 2005, in the Korean Intellectual Property Office, the disclosure of which is incorporated herein by reference.

BACKGROUND OF THE INVENTION

1. Field of the Invention

Apparatus and methods consistent with the present invention relate to a diode circuit having a passive element property, and an impedance modulator and a direct current (DC) source that use the diode circuit, and more particularly, to a diode circuit that has a passive element property by connecting a DC path to a diode and circulating a DC current, and an impedance modulator and a DC source that use the diode circuit.

2. Description of the Related Art

Various elements of an electronic circuit are classified into active elements or passive elements according to their characteristics. The passive elements consume energy while the active elements supply energy. Resistors, inductors, capacitors, and the like correspond to the passive elements. Diodes, transistors, and the like are some examples of the active elements.

FIGS. 1A and 1B are views illustrating a current property of a diode to which a predetermined radio frequency (RF) signal, i.e., an alternating current (AC) power $v_D(t)$, is applied. More specifically, if $v_D(t)=V_0 \cos \omega t$ is applied, a current $i_D(t)$ flowing through the diode is expressed as in Equation 1:

$$i_D(t) = I_S e^{\frac{v_D(t)}{nV_T}} = I_S e^{\frac{V_0 \cos \omega t}{nV_T}} = I_S e^{\alpha \cos \omega t} \left(\text{where}, \alpha = \frac{V_0}{nV_T}\right) \quad (1)$$

wherein $I_S$ denotes a reverse saturation current, $V_T$ denotes a threshold voltage, and n denotes a positive integer including "0". Equation 1 can also be expressed as in Equation 2:

$$\begin{aligned} i_D(t) &= I_S\left(\frac{a_0}{2} + a_1\cos\omega t + a_2\cos2\omega t + a_3\cos3\omega t + \ldots + a_n\cos n\omega t\right) \quad (2) \\ &= I_S\left(\frac{a_0}{2}\right) + I_S a_1\cos\omega t + I_S a_2\cos2\omega t + I_S a_3\cos3\omega t + \ldots + \\ &\quad I_S a_n\cos n\omega t \\ &= I_{DC} + i_1 + i_2 + i_3 + \ldots + i_n \end{aligned}$$

As shown in FIGS. 1A and 1B, when an AC signal is applied to the diode, a predetermined intensity of DC current $I_{DC}$ and different frequencies of AC currents $i_1, i_2, \ldots,$ and $i_n$ are generated due to the parabolic nature of the diode. Thus, the diode cannot be used in an RF path where a DC current is intercepted by a capacitor or the like, and this imposes limits on circuit design.

SUMMARY OF THE INVENTION

Accordingly, an aspect of the present invention is to address the above-mentioned problems and make it easier to design an RF circuit by providing a diode circuit, and an impedance modulator and a DC current source that use the diode circuit. More particularly, an aspect of the present invention provides a diode circuit in which the diode is used like a passive element by circulating a DC current generated by a diode along a DC path connected in parallel to the diode.

According to an aspect of the present invention, a diode circuit comprises: a first diode that generates a predetermined direct current (DC) and alternating currents (AC) when a radio frequency (RF) signal is applied; and a DC path that is connected in parallel to the first diode, forms a predetermined loop and circulates the DC current within the loop.

The DC path may comprise an inductor connected to the first diode in parallel.

The DC path may comprise an LC parallel resonator connected to the first diode in parallel.

The DC path may comprise a second diode that has the same current-voltage characteristic as the first diode. The second diode is disposed in the opposite direction to the first diode and connected to the first diode in parallel.

The diode circuit may further comprise a DC intercepting capacitor connected in series to a node formed between the first diode and the DC path to intercept an outflow of the DC current generated by the first diode.

According to another aspect of the present invention, there is provided an impedance modulator comprising: a power amplifier that amplifies the power of an input RF signal to a predetermined intensity and outputs the amplified RF signal; a first diode that connects an output node of the power amplifier to a ground terminal and generates predetermined intensities of DC and AC currents by receiving the amplified RF signal from the power amplifier; and a DC path that is connected in parallel to the first diode and forms a predetermined loop and circulates the DC current within the predetermined loop.

The impedance modulator may further comprise an impedance matching unit connected between the output node of the power amplifier and the first diode.

The impedance modulator may further comprise a DC intercepting capacitor that connects an anode terminal of the first diode to the impedance matching unit and intercepts transmission of the DC current generated by the first diode to the impedance matching unit.

The DC path may comprise a first inductor connected to the first diode in parallel.

The DC path may comprise an LC parallel resonator connected to the first diode in parallel.

The DC path may comprise a second diode that has the same current-voltage characteristic as the first diode. The second diode is disposed in the opposite direction to the first diode and connected to the first diode in parallel.

According to still another aspect of the present invention, there is provided a DC current source comprising: a first diode that generates predetermined DC and AC currents when an RF signal is applied; and a DC path that connects a cathode terminal of the first diode to a predetermined circuit network and pushes the DC current output through the cathode terminal of the first diode to the circuit network.

The DC path may comprise an inductor connected to the first diode in parallel.

The DC path may comprise an LC parallel resonator connected to the first diode in parallel.

The DC path may comprise a second diode that has the same current-voltage characteristic as the first diode. The second diode is disposed in the opposite direction to the first diode and connected to the first diode in parallel.

The DC current source may further comprise a DC intercepting capacitor connected in series to a node formed between the first diode and the DC path to intercept an outflow of the DC current generated by the first diode.

According to yet another aspect of the present invention, there is provided a DC current source comprising: a first diode that generates predetermined DC and AC currents when an RF signal is applied; and a DC path that connects a cathode terminal of the first diode to a predetermined circuit network and pulls a current of the predetermined intensity corresponding to the DC current from the circuit network.

The DC path may comprise an inductor connected to the first diode in parallel. The DC path may also comprise an LC parallel resonator connected to the first diode in parallel.

The DC path may comprise a second diode that has the same current-voltage characteristic as the first diode. The second diode is disposed in the opposite direction to the first diode and connected to the first diode in parallel.

The DC current source may further include a DC intercepting capacitor connected in series to a node formed between the first diode and the DC path to intercept an outflow of the DC current generated by the first diode.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1A:
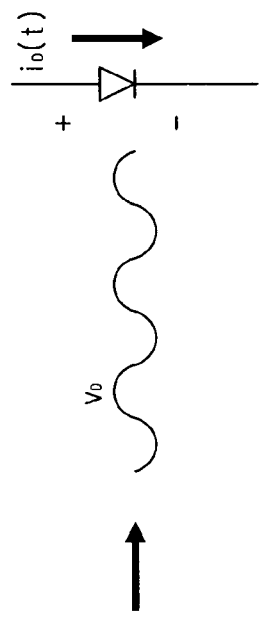
FIGS. 1A and 1B are views that illustrates an operation property of a diode.
Figure 1B:
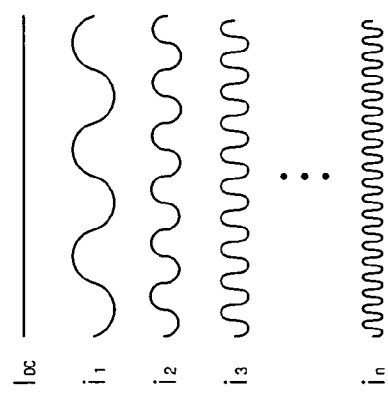

Certain exemplary embodiments of the present invention will be described in greater detail with reference to the accompanying drawings.

In the drawings, the same elements are denoted by the same reference numerals throughout the drawings. The matters defined in the description such as detailed construction and elements are simply provided to assist in a comprehensive understanding of the invention. Thus, it is apparent that the present invention can be carried out without those defined matters. Also in the following description, detailed descriptions of known functions and configurations incorporated herein have been omitted for conciseness and clarity.

Figure 2:
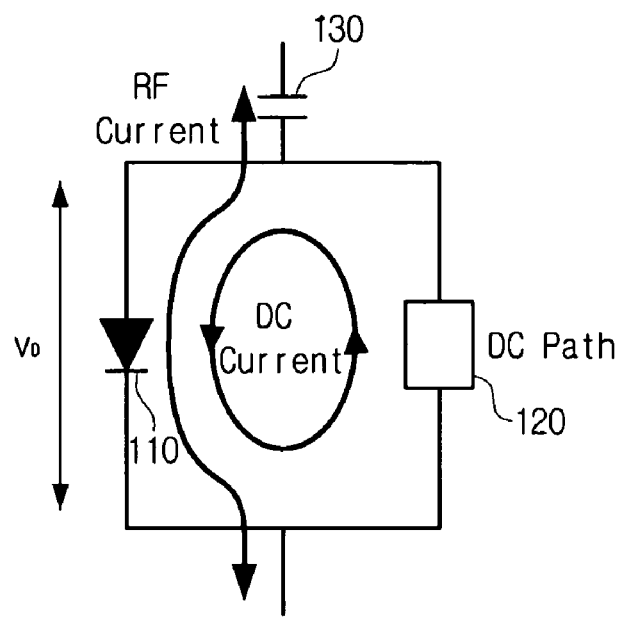
FIG. 2 is a view that illustrates a configuration of a diode circuit according to an exemplary embodiment of the present invention.

FIG. 2 is a view that illustrates a configuration of a diode circuit according to an exemplary embodiment of the present invention. Referring to FIG. 2, the diode circuit comprises a first diode 110, a DC path 120, and a DC intercepting capacitor 130.

The first diode 110 may be a general PN junction diode. The first diode 110 includes an anode terminal and a cathode terminal. If an AC voltage is applied between the anode terminal and the cathode terminal of the first diode 110, the first diode 110 generates DC and AC currents as represented in Equations 1 and 2.

The DC path 120 is embodied as a predetermined element capable of intercepting an AC component and connected to the first diode 110 in parallel. The DC current is output from the cathode terminal of the first diode 110 and transmitted through the DC path 120 to the anode terminal of the first diode 110. In other words, the DC current circulates within a loop formed between the first diode 110 and the DC path 120.

The DC intercepting capacitor 130 blocks the DC current generated by the first diode 110 and allows only the AC current to pass through it. The AC current flows in the direction indicated by an arrow shown in FIG. 2. As shown in FIG. 2, the DC intercepting capacitor 130 is used to prevent the DC current from flowing out but not necessarily required. In other words, since the DC path 120 has lower DC impedance (almost "0") than the DC intercepting capacitor 130, the DC current flows only into the DC path 120, and as a result, an RF circuit can be adopted without the DC intercepting capacitor 130.

Figure 3:
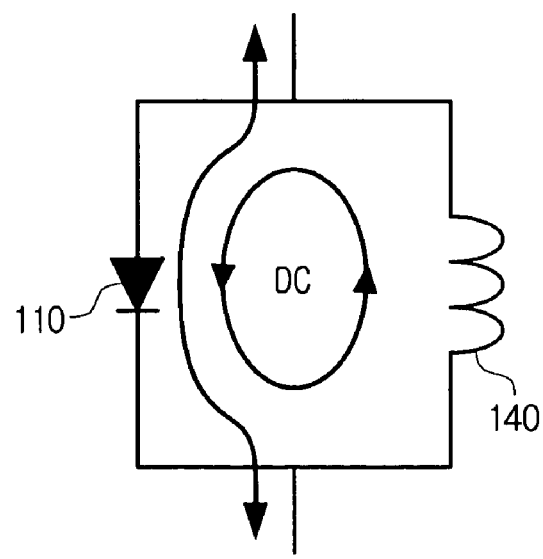
FIG. 3 is a circuit diagram of a diode circuit according to an exemplary embodiment of the present invention.

FIG. 3 is a circuit diagram in which the DC path 120 is embodied using an inductor 140. The inductor 140 allows a DC signal to pass through it but intercepts an AC signal. Thus, the inductor 140 connected in parallel to the first diode 110 operates as an RF choke. In this case, the inductor 140 should have a very high reactance property in order to prevent a portion of the AC current generated by the first diode 110 from circulating along the inductor 140. Although not shown in FIG. 3, the DC intercepting capacitor 130 may also be connected in series to a node formed between the first diode 110 and the inductor 140.

Figure 4:
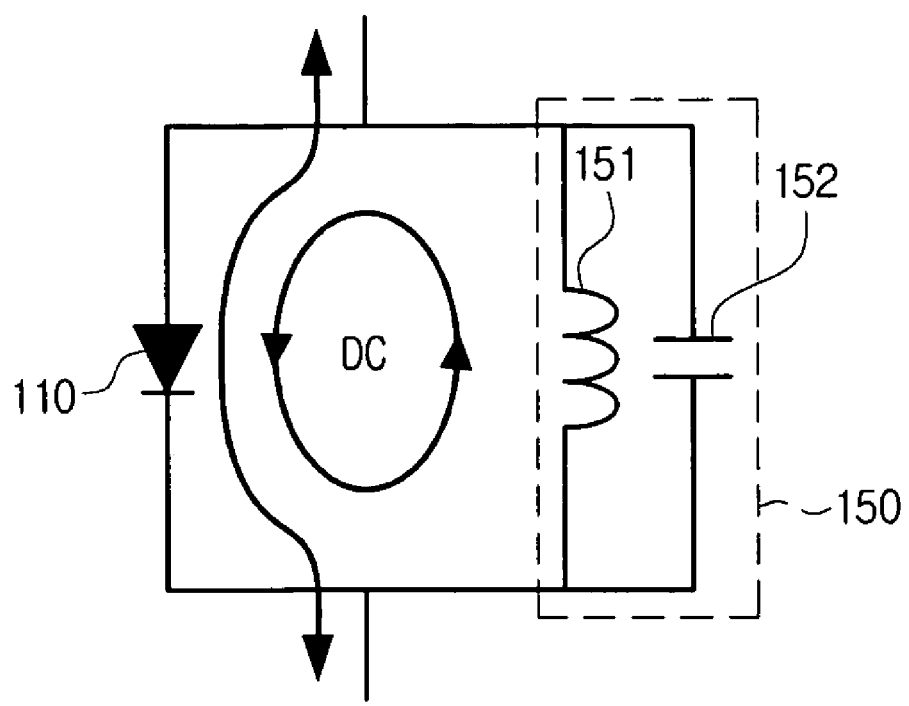
FIG. 4 is a circuit diagram of a diode circuit according to another exemplary embodiment of the present invention.

FIG. 4 is a circuit diagram in which the DC path 120 is embodied using an LC parallel resonator 150. In detail, the LC parallel resonator 150 is connected to the first diode 110 in parallel and includes a resonance inductor 151 and a resonance capacitor 152 connected in parallel to each other. The LC parallel resonator 150 generally produces a band-stop type resonance. In other words, the LC parallel resonator 150 can prevent even the AC current with a certain frequency from circulating since it filters an AC current signal with the frequency corresponding to the resonance frequency determined by the values of the resonance inductor 151 and the resonance capacitor 152. Here, an inductor much smaller than the inductor 140 shown in FIG. 3 may be used as the resonance inductor 151, which can save space.

Figure 5:
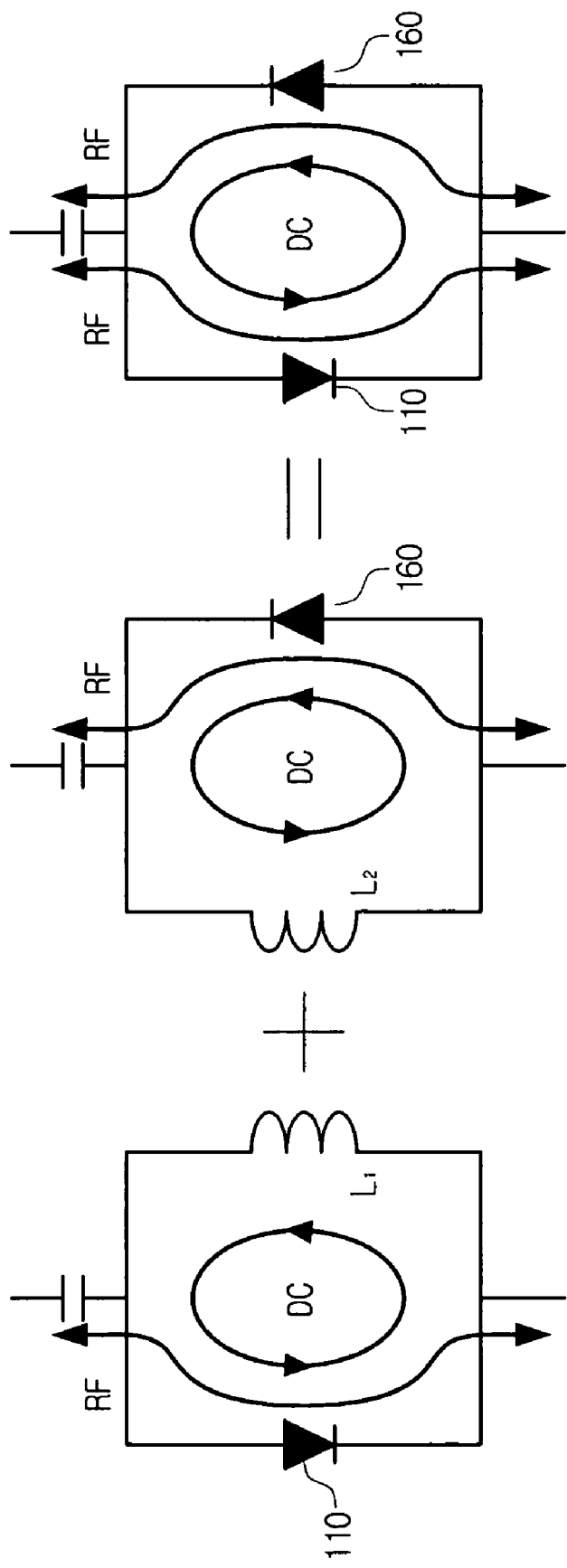
FIG. 5 is a circuit diagram of a diode circuit according to still another exemplary embodiment of the present invention.

FIG. 5 is a circuit diagram in which the DC path 120 is embodied using a second diode disposed opposite to the first diode 110. A circuit with the first diode 110 connected in parallel to an inductor L1 of predetermined size and a circuit with a second diode 160 connected in parallel to an inductor L2 of predetermined size each operate as the diode circuit shown in FIG. 3. Here, a circuit in which the second diode 160 is disposed opposite to and connected in parallel to the first diode 110 may be embodied by combining the two circuits. The second diode 160 may be a diode with the same current-voltage characteristic as the first diode 110.

In the circuit in which the first and second diodes 110 and 160 are combined, a DC current output from a cathode terminal of the first diode 110 is input into an anode terminal of the second diode 160. The DC current generated by the second diode 160 is also input through the first diode 110 into the second diode 160. As a result, each DC current generated by the first and second diodes 110 and 160 circulates within a loop. On the other hand, each AC current generated by the first and second diodes 110 and 160 is output outside. Thus, if the same amplitude of RF power is applied to the first and second diodes 110 and 160, the amount of the AC currents output outside is twice as much as the amount of the AC currents in the circuits shown in FIGS. 3 and 4. Also, placing the first and second diodes 110 and 160 opposite to each other may offset even harmonic components of the AC currents generated by the first and second diodes 110 and 160.

Figure 6:
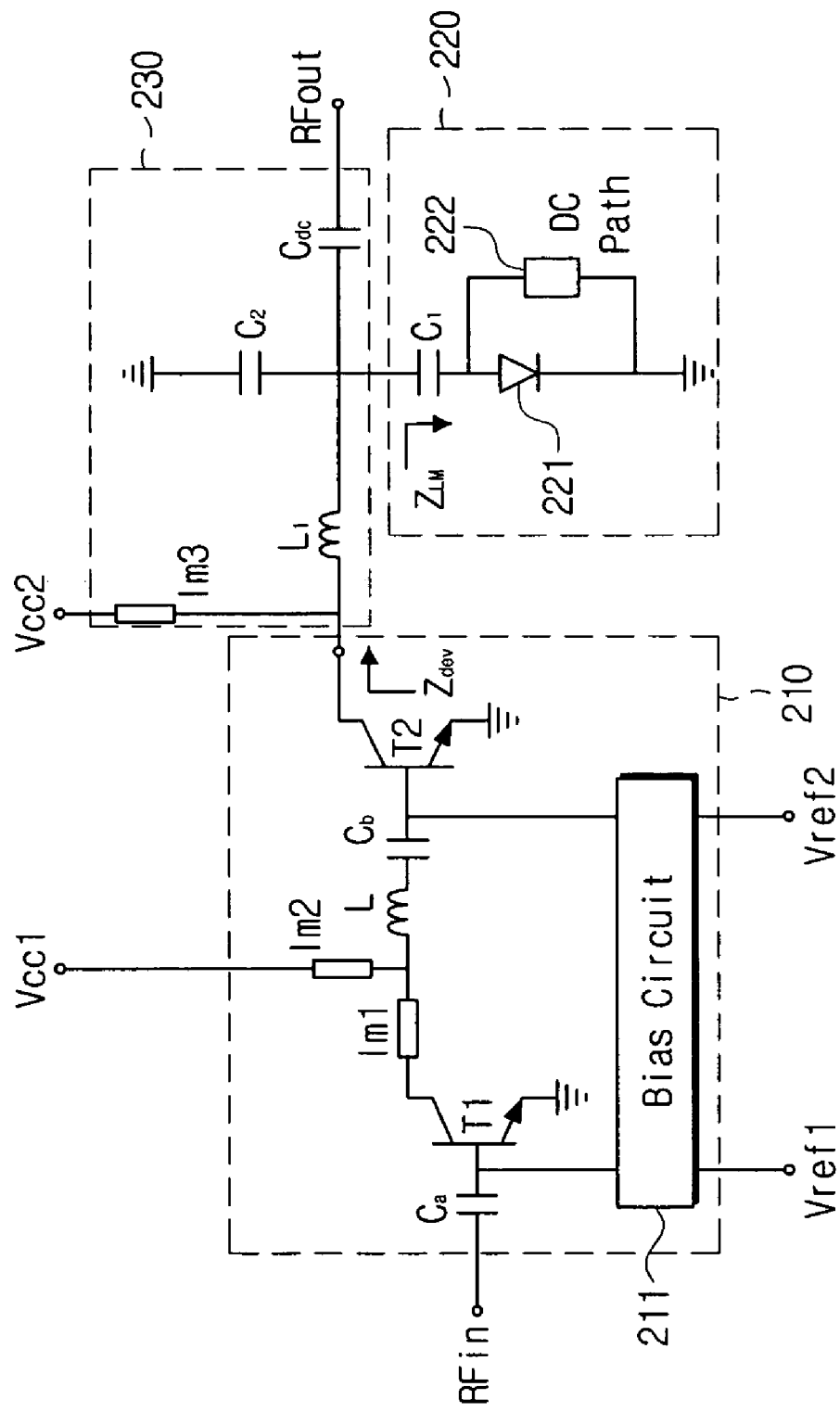
FIG. 6 is a circuit diagram of an impedance modulator according to an exemplary embodiment of the present invention.

FIG. 6 is a circuit diagram of an impedance modulator that uses the diode circuit shown in FIGS. 2 through 5 according to an exemplary embodiment of the present invention. Referring to FIG. 6, the impedance modulator comprises a power amplifier 210, an impedance calibrator 220, and an impedance matching unit 230.

The power amplifier 210 comprises a plurality of transistors T1 and T2, a plurality of capacitors Ca and Cb, a plurality of impedance elements Im1 and Im2, an inductor L, and a bias circuit 211. The bias circuit 211 supplies each base terminal of the transistors T1 and T2 with a predetermined intensity of bias power. The transistor T1 amplifies an RF input signal input through an input node RFin. A power of the signal output from the transistor T1 is altered to have a predetermined intensity by the impedances of the impedance elements Im1 and Im2, the inductor L, the capacitor Cb, and the like. Thus, the signal output from the transistor T1 is amplified to an RF signal of predetermined intensity by the transistor T2.

A signal output from the power amplifier 210 is applied to the impedance calibrator 220 through an inductor L1. The impedance calibrator 220 comprises a DC intercepting capacitor C1, a diode 221, and a DC path 222. The structure of the impedance calibrator 220 is the same as the one in FIG. 2. Also, the DC path 222 may be embodied using an inductor, an LC parallel resonator, or a diode as shown in FIGS. 3, 4, and 5. The operation of the impedance calibrator 220 is the same as that of the diode circuits shown in FIGS. 2 through 5 and thus will not be described herein.

The impedance matching unit 230 may be embodied by combination of the inductor L1, capacitors C2 and $C_{DC}$, and the like. An RFout shown in FIG. 6 is connected to an antenna. Accordingly, the impedance matching unit 230 and the impedance calibrator 220 convert the impedance of an antenna input terminal into an impedance $Z_{dev}$ with respect to an output node of the power amplifier 210. Since impedance $Z_{LM}$ with respect to the input node of the impedance calibrator 220 varies depending on the level of an output power, the impedance $Z_{dev}$ with respect to the output node of the power amplifier 210 also varies depending on the level of the output power. The degree of variation in the impedance $Z_{dev}$ according to the level of the output power may be controlled by different designs of the impedance matching unit 230. The impedance matching unit 230 reduces the amplitude of harmonic signals except basic frequency components among the AC current components output through the impedance calibrator 220.

Figure 7:
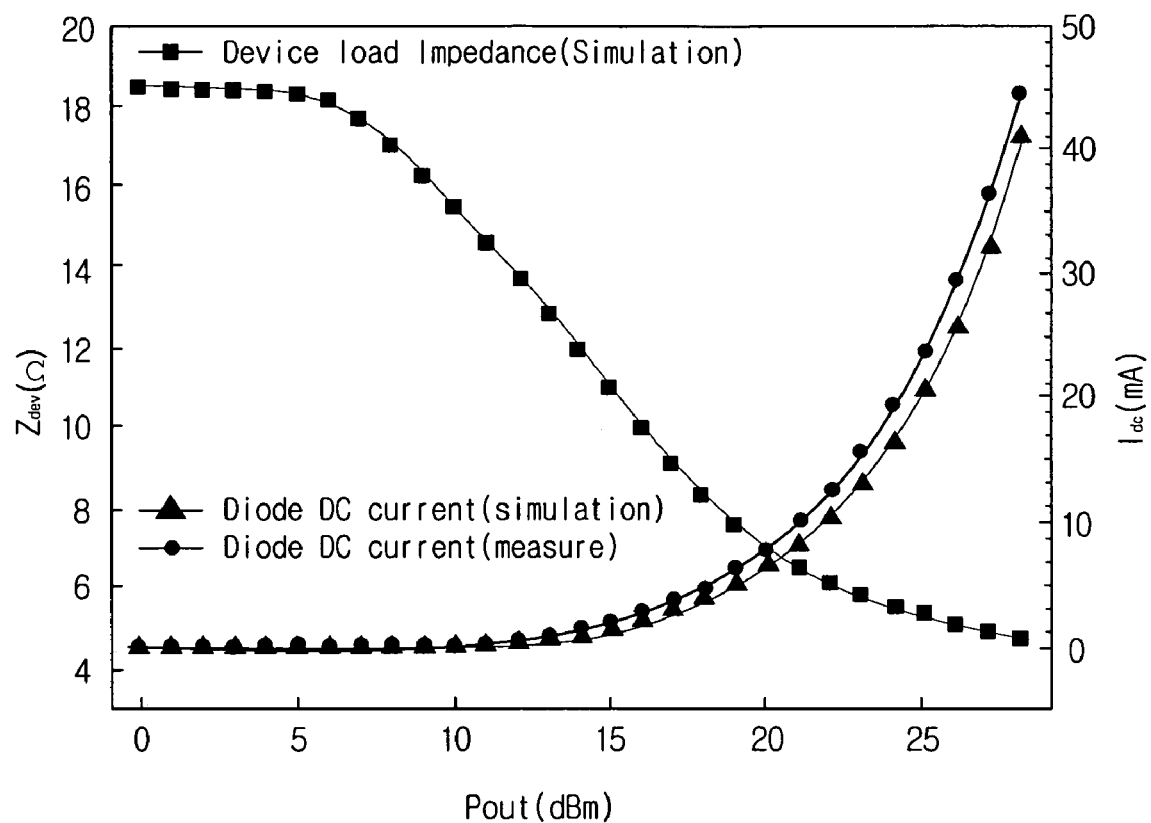
FIG. 7 is a graph that illustrates an impedance variation property of the impedance modulator shown in FIG. 6.

FIG. 7 is a graph that illustrates an impedance variation characteristic of the impedance modulator shown in FIG. 6. As shown in FIG. 7, a line marked with "■" indicates the impedance $Z_{dev}$ with respect to the output node of the power amplifier 210. The impedance $Z_{dev}$ decreases as the power Pout of the signal output from the power amplifier 210 increases. This is due to the current-voltage characteristic of the diode 221 in the impedance calibrator 220.

The impedance of the diode 221 is computed using the following method. If a signal $V_D(t)$ output from the power amplifier 210 is $V_0 \cos \omega t$ as in the above-described example, Equation 2 can be rearranged to represent the DC current $I_{DC}$ and the AC currents $i_1$, $i_2$, and $i_3$ as follows:

$$I_{DC} = I_S\left(\frac{a_0}{2}\right) = I_S\left(\frac{2I_0(\alpha)}{2}\right) = I_S I_0(\alpha) \quad (3)$$

$$i_1 = I_S a_1 \cos\omega t = I_S 2I_1(\alpha)\cos\omega t = 2I_S I_1(\alpha)\cos\omega t$$

$$i_2 = I_S a_2 \cos 2\omega t = I_S\left[2I_0(\alpha) - \frac{4}{\alpha}I_1(\alpha)\right]\cos 2\omega t$$

$$i_3 = I_S a_3 \cos 3\omega t = I_S\left[-\frac{8}{\alpha}I_0(\alpha) + \left(2 + \frac{16}{\alpha^2}\right)I_1(\alpha)\right]\cos 3\omega t$$

wherein $a_0$, $a_1$, $a_2$ and $a_3$ are arbitrary constants, $\alpha$ denotes $V_0/nV_T$, and $I_0(\alpha)$, $I_1(\alpha)$, $I_2(\alpha)$ and $I_3(\alpha)$ denote modified Bessel functions. For convenience, computations of $i_4$ through $I_n$ will be omitted. The impedance $Z_D$ of the diode 221 with respect to a basic frequency signal $i_1$ can be expressed as in Equation 4:

$$Z_D = \frac{V_0 \cos\omega t}{i_1(\alpha)} = \frac{V_0 \cos\omega t}{2I_S I_1(\alpha)\cos\omega t} = \frac{V_0}{2I_S I_1(\alpha)} \quad (4)$$

As shown in Equation 4, the impedance $Z_D$ is a monotone decreasing function with respect to $\alpha$ and thus decreases as the level of the output power, i.e., $V_0$, increases. A DC current generated by the diode 221 circulates along the DC path 222, and the impedance of the diode 221 changes depending on the level of the output power. As a result, the impedance calibrator 220 comprising the diode 221 and the DC path 222 allows the impedance $Z_{dev}$ with respect to the output node of the power amplifier 210 to change automatically depending on the level of the output power. Using the above-described characteristics of the impedance calibrator 220, the impedance $Z_{dev}$ with respect to the output node of the power amplifier 210 may be automatically modulated depending on the level of the output power, as shown in FIG. 7.

FIG. 7 is a graph that illustrates a substantially measured value and a simulated value of a DC current generated by the diode 221. Here, the substantially measured value and the simulated value are marked with "●" and "▲" respectively. The DC current increases as the power Pout increases. Based on this characteristic, the present diode circuit may be used as a DC current source.

Figure 8:
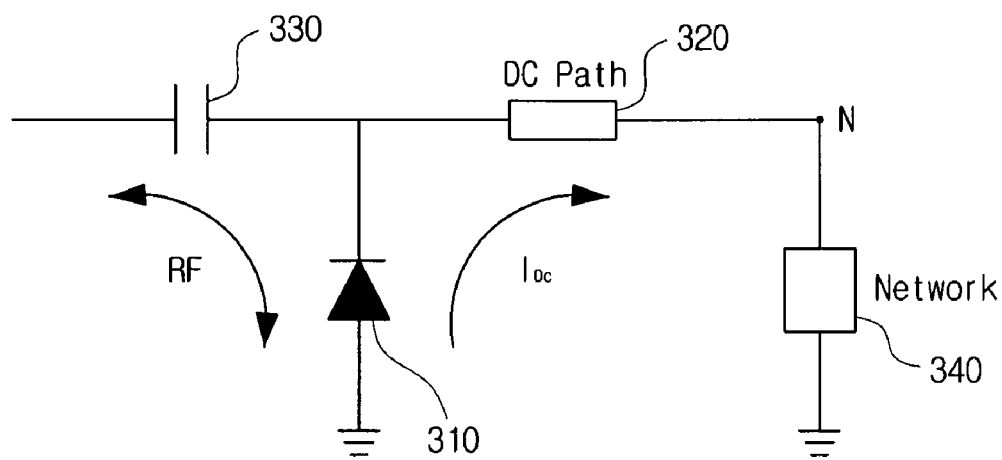
FIG. 8 is a circuit diagram of a DC current source according to an exemplary embodiment of the present invention.
Figure 9:
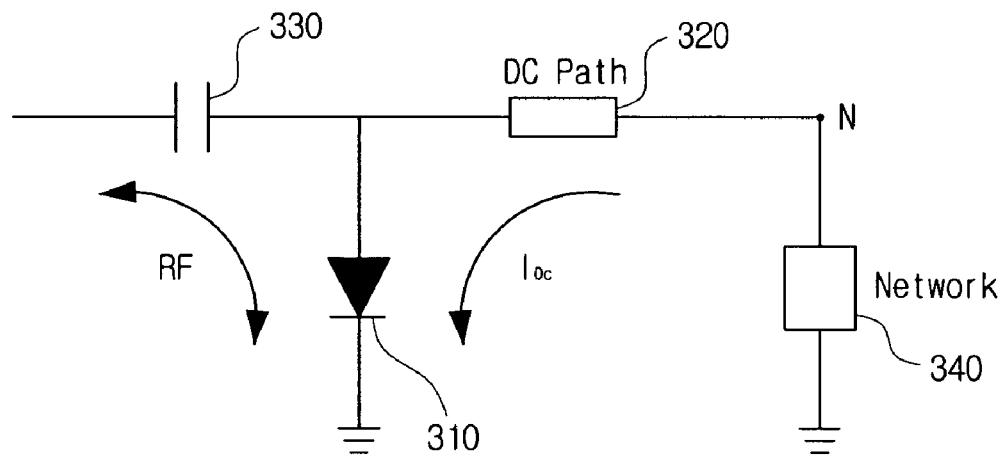
FIG. 9 is a circuit diagram of a DC current source according to another exemplary embodiment of the present invention.

FIGS. 8 and 9 are circuit diagrams that illustrate the configuration of a DC current source according to an exemplary embodiment of the present invention using the diode circuit shown in FIGS. 2 through 5.

FIG. 8 is a circuit diagram of a DC current source that pushes a DC current to an external circuit network. The external circuit network may be a predetermined electronic circuit that uses a DC current transmitted through a DC path 320. The DC current source shown in FIG. 8 comprises a diode 310, the DC path 320, and a DC intercepting capacitor 330. One terminal of the DC path 320 is connected to a cathode terminal of the diode 310, and the other terminal of the DC path 320 is connected to an input node N of a circuit network 340.

Thus, the DC current generated by the diode 310 is transmitted through the DC path 320 to the circuit network 340. As a result, a positive voltage is applied to the input node N of the circuit network 340. In other words, the DC current source shown in FIG. 8 operates as a DC current pushing pump.

FIG. 9 is a circuit diagram of a DC current source pulling a DC current from an external circuit network. In the DC current source shown in FIG. 9, a diode 310 is disposed in the opposite direction to the diode 310 shown in FIG. 8. In other words, one terminal of a DC path 320 is connected to an anode terminal of the diode 310, and the other terminal of the DC path 320 is connected to an input node N of a circuit network 340. Accordingly, a DC signal that has the intensity corresponding to the DC current generated by the diode 310 is pulled from the circuit network 340, and a negative voltage is applied to the input node N of the circuit network 340. The DC current source shown in FIG. 9 operates as a DC current pulling pump.

The DC path 320 shown in FIGS. 8 and 9 may be embodied using an inductor, an LC parallel resonator, a reverse diode, or the like as shown in FIGS. 3-5.

The circuits shown in FIGS. 8 and 9 may be used to build an analog-to-digital converter (ADC) that converts an input RF signal, i.e., an AC signal, into a DC signal. Also, the power of an RF signal can be detected by checking the intensity of a DC current without a separate coupler circuit. In this case, the circuit network 340 may be embodied as an RF detecting circuit that detects the intensity of an input RF signal by checking the intensity of a DC current.

As described above, according to the present invention, a DC current component generated by a diode can be processed so that the diode can be used in an RF circuit like a passive element, which can relieve difficulty in designing an RF circuit. Also, a diode circuit according to the present invention can be used to build various types of electronic circuits such as an impedance modulator, a DC current source, and the like.

The foregoing exemplary embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A diode circuit comprising:
a first diode that generates a predetermined direct current (DC) and alternating currents (AC) when a radio frequency (RF) signal is applied; and
a DC path that is connected in parallel to the first diode, forms a predetermined loop and circulates the DC current within the loop.

2. The diode circuit of claim 1, wherein the DC path comprises an inductor connected to the first diode in parallel.

3. The diode circuit of claim 1, wherein the DC path comprises an LC parallel resonator connected to the first diode in parallel.

4. The diode circuit of claim 1, wherein the DC path comprises a second diode that has a same current-voltage characteristic as the first diode, is disposed in an opposite direction to the first diode and is connected to the first diode in parallel.

5. The diode circuit of claim 1, further comprising:
a DC intercepting capacitor connected in series to a node formed between the first diode and the DC path to intercept an outflow of the DC current generated by the first diode.

6. An impedance modulator comprising:
a power amplifier that amplifies a power of an input RF signal to a predetermined intensity and outputs the amplified RF signal;
a first diode that connects an output node of the power amplifier to a ground terminal and generates predetermined intensities of DC and AC currents by receiving the amplified RF signal from the power amplifier; and
a DC path that is connected in parallel to the first diode and forms a predetermined loop and circulates the DC current within the loop.

7. The impedance modulator of claim 6, further comprising:
an impedance matching unit connected between an output node of the power amplifier and the first diode.

8. The impedance modulator of claim 7, further comprising:
a DC intercepting capacitor that connects an anode terminal of the first diode to the impedance matching unit and intercepts transmission of the DC current generated by the first diode to the impedance matching unit.

9. The impedance modulator of claim 7, wherein the DC path comprises a first inductor connected to the first diode in parallel.

10. The impedance modulator of claim 7, wherein the DC path comprises an LC parallel resonator connected to the first diode in parallel.

11. The impedance modulator of claim 7, wherein the DC path comprises a second diode that has a same current-voltage characteristic as the first diode, is disposed in an opposite direction to the first diode and is connected to the first diode in parallel.

12. A DC current source comprising:
a first diode that generates predetermined DC and AC currents when an RF signal is applied; and
a DC path that connects a cathode terminal of the first diode to a predetermined circuit network and pushes the DC current output through the cathode terminal of the first diode to the circuit network.

13. The DC current source of claim 12, wherein the DC path comprises an inductor connected to the first diode in parallel.

14. The DC current source of claim 12, wherein the DC path comprises an LC parallel resonator connected to the first diode in parallel.

15. The DC current source of claim 12, wherein the DC path comprises a second diode that has a same current-voltage characteristic as the first diode, is disposed in an opposite direction to the first diode and is connected to the first diode in parallel.

16. The DC current source of claim 12, further comprising:
a DC intercepting capacitor connected in series to a node formed between the first diode and the DC path to intercept an outflow of the DC current generated by the first diode.

17. A DC current source comprising:
a first diode that generates predetermined DC and AC currents when an RF signal is applied; and
a DC path that connects a cathode terminal of the first diode to a predetermined circuit network and pulls a current of the predetermined intensity corresponding to the DC current from the circuit network.

18. The DC current source of claim 17, wherein the DC path comprises an inductor connected to the first diode in parallel.

19. The DC current source of claim 17, wherein the DC path comprises an LC parallel resonator connected to the first diode in parallel.

20. The DC current source of claim 17, wherein the DC path comprises a second diode that has a same current-voltage characteristic as the first diode, is disposed in an opposite direction to the first diode and is connected to the first diode in parallel.

21. The DC current source of claim 17, further comprising:
 a DC intercepting capacitor connected in series to a node formed between the first diode and the DC path to intercept an outflow of the DC current generated by the first diode.

* * * * *